(12) United States Patent
Champagne et al.

(10) Patent No.: US 12,264,394 B1
(45) Date of Patent: Apr. 1, 2025

(54) CHEMICAL VAPOR INFILTRATION DENSIFICATION METHOD USING SINGLE-PILE PLATES FOR A SEMI-FORCED FLOW

(71) Applicants: SAFRAN LANDING SYSTEMS, Velizy-Villacoublay (FR); SAFRAN CERAMICS, Le Haillan (FR)

(72) Inventors: Matthieu Champagne, Moissy-Cramayel (FR); Jeff Roustand, Moissy-Cramayel (FR); Franck Lamouroux, Moissy-Cramayel (FR); Sébastien Bertrand, Moissy-Cramayel (FR)

(73) Assignees: SAFRAN LANDING SYSTEMS, Velizy-Villacoublay (FR); SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 18/838,765

(22) PCT Filed: Feb. 16, 2023

(86) PCT No.: PCT/FR2023/050209
§ 371 (c)(1),
(2) Date: Aug. 15, 2024

(87) PCT Pub. No.: WO2023/156740
PCT Pub. Date: Aug. 24, 2023

(30) Foreign Application Priority Data

Feb. 16, 2022 (FR) ..................................... 2201361

(51) Int. Cl.
*C23C 16/455* (2006.01)
*C23C 16/04* (2006.01)
(Continued)

(52) U.S. Cl.
CPC ........ *C23C 16/4583* (2013.01); *C23C 16/045* (2013.01); *C23C 16/4409* (2013.01)

(58) Field of Classification Search
CPC .............. C23C 16/4583; C23C 16/045; C23C 16/4409
See application file for complete search history.

(56) References Cited

U.S. PATENT DOCUMENTS 7,892,646 B1   2/2011  Rudolph et al.
10,655,219 B1* 5/2020  Finley ................. C23C 16/4412
(Continued)

FOREIGN PATENT DOCUMENTS

FR  2 821 859 A1  9/2002
FR  2 834 713 A1  7/2003
FR  3 084 892 A1  2/2020

OTHER PUBLICATIONS

International Search Report as issued in International Patent Application No. PCT/FR2023/050209, dated May 30, 2023.
(Continued)

*Primary Examiner* — Joseph A Miller, Jr.
(74) *Attorney, Agent, or Firm* — Pillsbury Winthrop Shaw Pittman LLP

(57) ABSTRACT

A method for densifying porous annular substrates having a central passage by chemical vapor infiltration, the method including providing stacks of porous annular substrates, providing a plurality of individual modules including stacks disposed on a support plate having a perforated injection tube each mounted on a gas inlet opening, forming a stack of individual modules, aligning the individual modules of the stack in a sealed manner by means of an annular seal disposed between the injection tube of a second individual module and the gas inlet opening of a first individual module with which it cooperates, and injecting into the internal volume of each stack of porous annular substrates a gas (Continued)

phase including a gaseous precursor of a matrix material to be deposited within the porosities of the substrates.

13 Claims, 4 Drawing Sheets

(51) Int. Cl.
*C23C 16/44* (2006.01)
*C23C 16/458* (2006.01)

(56) References Cited

U.S. PATENT DOCUMENTS

2003/0118728 A1  6/2003  Sion et al.
2021/0285098 A1  9/2021  Kirkpatrick

OTHER PUBLICATIONS

Written Opinion of the International Searching Authority as issued in International Patent Application No. PCT/FR2023/050209, dated May 30, 2023.

\* cited by examiner

[Fig. 1]
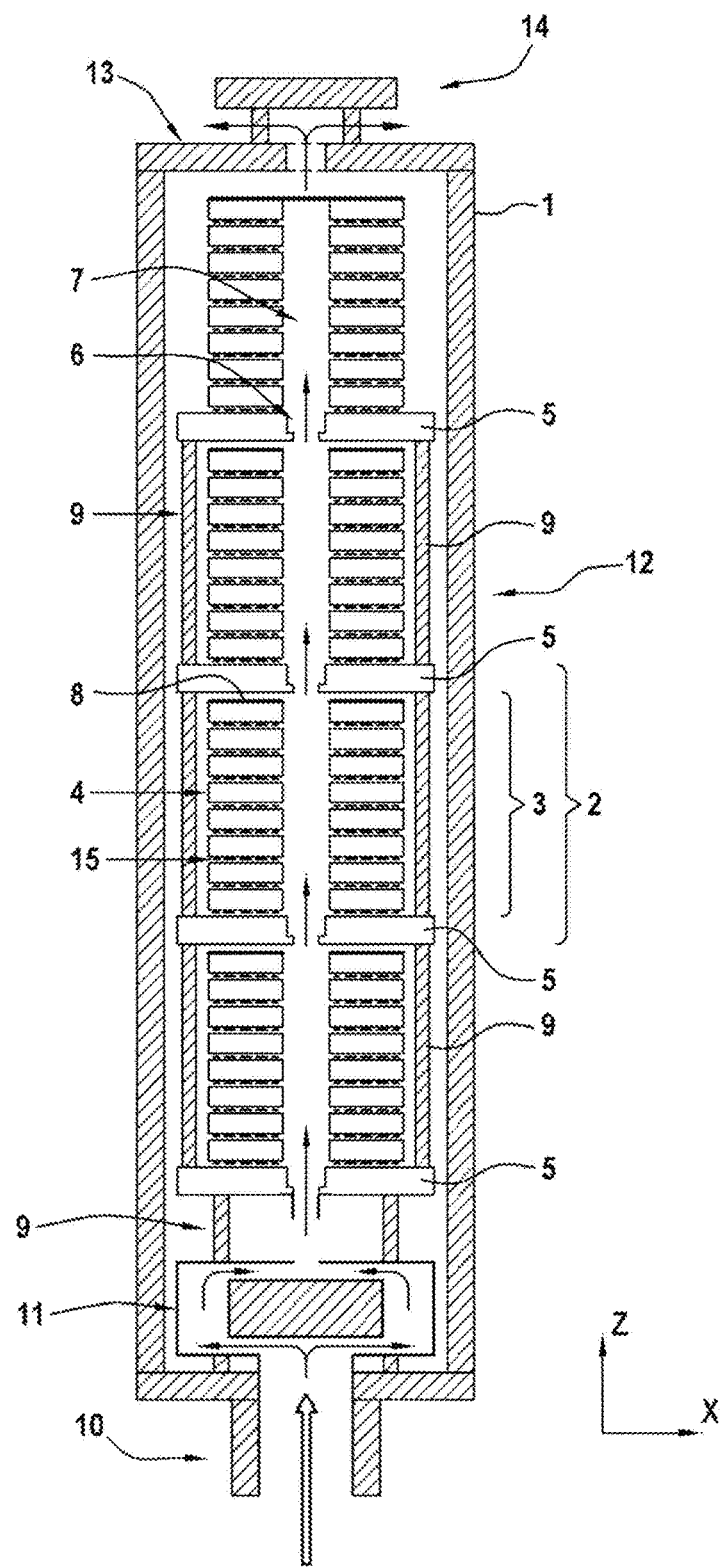
PRIOR ART

[Fig. 2]
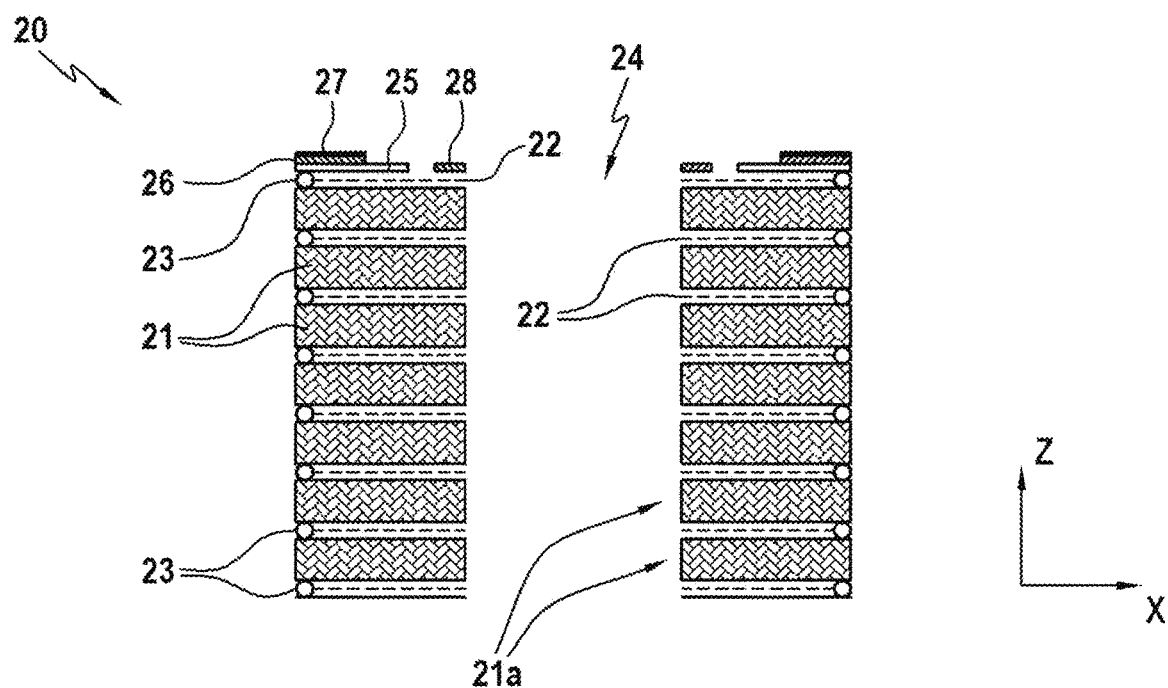

[Fig. 3]
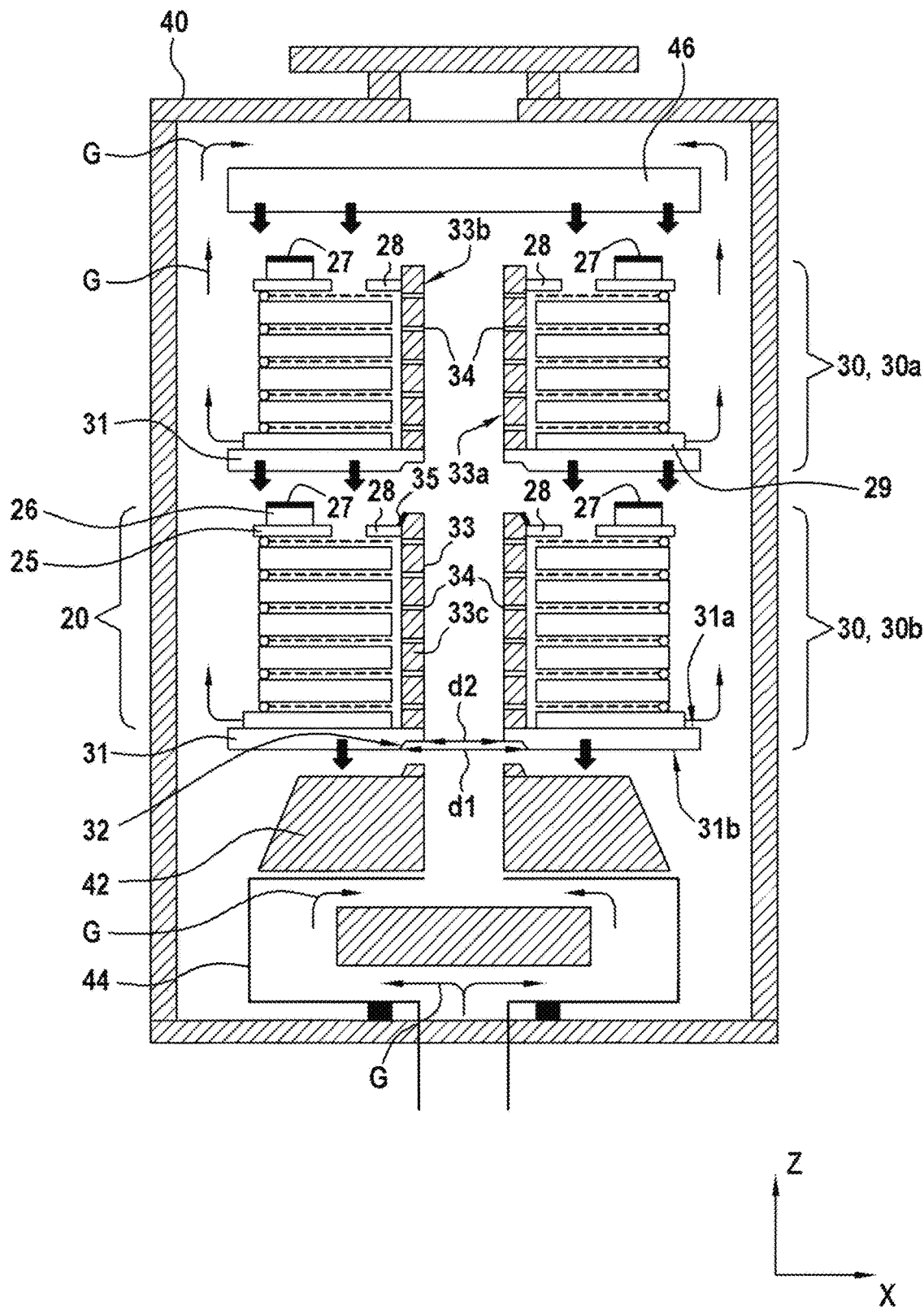

[Fig. 4]
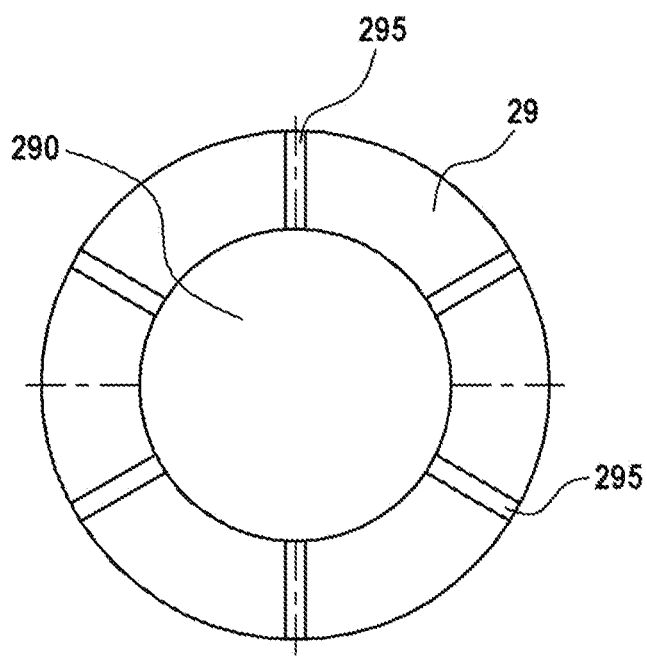
[Fig. 5]

CHEMICAL VAPOR INFILTRATION DENSIFICATION METHOD USING SINGLE-PILE PLATES FOR A SEMI-FORCED FLOW

CROSS-REFERENCE TO RELATED APPLICATIONS

This application is the U.S. National Stage of PCT/FR2023/050209, filed Feb. 16, 2023, which in turn claims priority to French patent application number 22 01361 filed Feb. 16, 2022. The content of these applications are incorporated herein by reference in their entireties.

TECHNICAL FIELD

The invention concerns the production of composite material parts comprising a porous annular substrate densified by chemical vapor infiltration (CVI), and more particularly to the production of parts provided with a central passage.

The invention is especially, but not exclusively, applicable to the production of annular brake discs or diverging nozzles for rocket engines made of thermostructural composite material.

PRIOR ART

Thermostructural composite materials are noteworthy for their excellent mechanical properties and their ability to retain these properties at high temperature. Typical examples of thermostructural composite materials are carbon-carbon (C—C) composites comprising a porous reinforcing substrate of carbon fibers densified by a carbon matrix and ceramic matrix composites (CMC) comprising a porous reinforcing substrate of refractory fibers (e.g. carbon or ceramic) densified by a ceramic matrix (e.g. silicon carbide).

C—C composite materials are commonly used for aircraft brake discs due to their high-energy tribological characteristics, their non-brittleness, their thermal characteristics (conductivity and caloric capacity) and their density.

The densification of porous substrates by chemical vapor infiltration (CVI) consists of placing the annular preforms in a reaction chamber of an infiltration installation and admitting into the chamber a gas phase, one or more constituents of which form a precursor of the matrix material to be deposited within the substrates to ensure their densification. The infiltration conditions, especially the composition and flow rate of the gas phase, and the temperature and pressure in the chamber, are chosen to allow diffusion of the gas phase within the accessible internal porosity of the substrates so that the desired material is deposited therein by decomposition of a constituent of the gas phase or by reaction between several constituents thereof.

Document FR 2,834,713 describes such a method and an installation for implementing it.

The conditions for chemical vapor infiltration of pyrolytic carbon, or pyrocarbon, have long been known to the person skilled in the art. The carbon precursor is an alkane, an alkyl or an alkene, generally propane, methane or a mixture of the two. The infiltration is carried out at a temperature of approximately 1000° C. under a pressure of approximately 1 kPa, for example.

The gas phase containing the precursor(s) of material to be deposited within the preforms is admitted at one longitudinal end of the reaction chamber, while the residual gases are evacuated at the opposite end from where they are extracted by pumping means.

The reactors intended for carrying out research and development studies on brake disc infiltration have a loading configuration conventionally consisting of a stack of plates each carrying a single stack of disks. These are so-called "single-stack" furnaces. This configuration differs from industrial loads, produced in larger reactors, in which the plates carry several stacks of disks side by side, so-called "multi-stack" furnaces.

In both cases, the disks are separated by intermediate supports called spacers, and the plates comprise openings aligned with central passages of the disks in order to circulate in each stack a reactive gas phase which will then pass through the disks to densify them. An upper plate surmounts the load and closes the internal volume of each stack. The plates supporting the disk stacks are held with vertical rods.

The conventional densification method, used industrially and applicable in the furnace used in research and development, is directed flow.

A known example of single-stack loading of disks that can be used in a reaction chamber commonly referred to as a "densification furnace" is illustrated in FIG. 1.

The chamber 1 has cylindrical symmetry around an axis Z. The load comprises a stack of individual modules 2, each individual module 2 comprising a single stack 3 of porous annular substrates 4 borne by a lower support plate 5. The plates 5 comprise openings 6 aligned with central passages 7 of the substrates 4 in order to circulate, in each stack 3, a reactive gas phase which will then pass through the substrates 4 to densify them. Each stack 3 is surmounted by an annular cover disk 8 and each individual module 2 further comprises vertical rods 9 extending between the support plate 5 of the individual module 2 and the support plate 5 of the individual module 2 above. The vertical rods 9 serve to take up the mass of the upper support plates 5 and thus make it possible to ensure that the support plates 5 are held in place.

FIG. 1 is a representation of the hot zone of a directed flow load. This hot zone comprises, from its base to its top: an inlet for the reaction gas mixture 10, then a preheating zone 11 which makes it possible to increase the temperature of the gases to the densification temperature, and finally the loading zone 12. At the top of the furnace, at the susceptor cover 13, a chimney 14 is installed in the cover 13, through which the effluent gases resulting from the deposition reaction are evacuated.

On each plate 5 is found a stack of substrates 4 separated by spacers 15, each stack terminating at its top in a cover disk 8 which limits leaks.

The gases at the end of the preheating zone 11 enter each of the columns constituted by the stacks 3 of substrates 4. The gas passes from the inside to the outside of the columns of substrates 4 through leaks constituted by the porosities of each preform 4, the clearance between the substrates 4 created by the spacers 15, and the passages between the plates 5.

Document FR 2,821,859 discloses a chemical vapor infiltration densification method for porous substrates especially using a semi-forced flow. To adapt the semi-forced flow as described in this document, leaks between the substrates must be controlled and leaks at the passage between plates must also be controlled. In other words, the control of leaks other than those related to the porosities of the preforms 4 makes it possible to improve the densification kinetics: This is the implementation of the so-called "semi-forced flow" method.

The implementation of semi-forced flow consists of providing calibrated leak passages between the inside and outside of substrate columns, which involves sealing areas left free in the implementation of the current directed flow method: These zones are located in particular at the inter-disk spacers and at the junction between the lower stack and the support plate of the upper individual module.

A pressure gradient will be established and increase as the preforms densify between the inside (where the gas arrives) and the outside of the stacks. The installation of calibrated leaks must allow this pressure gradient to be capped in order to avoid soot deposits inside the stack of substrates due to a pressure that is too high. The monitoring of this pressure gradient, which reflects the progress of densification, is therefore necessary for the conduct of the cycle.

Leaks at the passage between plates are the most difficult to control because the stacks of porous annular substrates are not of the same height. And in the absence of an excellent control of this seal at the top of each stack, the pressure difference necessary to force the gas to go into the porosities of the substrates 2 cannot be obtained.

It is also known from patent FR 3,084,892 to replace the rods with gas distributors, which make it possible to simultaneously perform the functions of taking up the load (function previously performed by the rods), guiding the gases (cold), which avoids cooling the disks, and gas distribution at the preform level.

DISCLOSURE OF THE INVENTION

The aim of the invention is to provide a technical solution for the implementation of a densification method which makes it possible to improve the distribution of the reactive gas within a loading zone of a densification furnace and, in general, to reduce densification gradients between substrates located at different locations in the loading zone, without affecting the loading capacity of the furnace, or even increasing it.

One object of the invention proposes a densification method by pressure gradient chemical vapor infiltration of porous annular substrates having a central passage, the method comprising at least the following steps:

providing a plurality of stacks of porous annular substrates, each stack comprising an internal volume formed by the central passages of the stacked substrates, providing a plurality of individual modules, each individual module comprising a support plate and a single stack of porous annular substrates disposed on the support plate, the support plate having a gas inlet opening and an injection tube mounted on the gas inlet opening and extending into the internal volume of the stack between a first tube end connected to the support plate and a second tube end which is free, the injection tube further comprising gas injection orifices opening into the internal volume, forming, in the chamber of a densification furnace, a stack of individual modules, each first individual module stacked on a second individual module having its gas inlet opening of the support plate communicating with the second end of the injection tube of the second individual module on which it is stacked so as to permit the circulation of a gas between the individual modules, and injecting into the internal volume of each stack of porous annular substrates a gas phase comprising a gaseous precursor of a matrix material to be deposited within the porosities of the substrates.

According to a general characteristic of the invention, in each individual module, each first porous annular substrate is supported on a second porous annular substrate, or is supported on the support plate, by means of a sealing ring providing radial sealing between the first porous annular substrate and the second porous annular substrate or between the first porous annular substrate and said support plate.

In other words, each individual module comprises a plurality of sealing rings, each sealing ring being placed in support between two successive porous annular substrates or between a porous annular substrate and the support plate.

"Radial sealing" is understood to mean sealing preventing the circulation of the gas along a radial direction between the internal volume of the stacks and the outside of the stacks.

The invention thus makes it possible to better control the circulation of the gas around the porous annular substrates and thus to improve the distribution of the gas in the furnace chamber.

Furthermore, in each individual module, each sealing ring is coupled to an annular spacer having an inner diameter equal to an inner diameter of the porous annular substrates.

The annular spacers allow the sealing rings to be centered and thus facilitate their positioning.

Each annular spacer has a thickness less than the thickness of the sealing ring to which it is coupled. This thickness ratio has the advantage of ensuring that the porous annular substrate is supported on the sealing ring. This ensures radial sealing. In addition, this thickness ratio offers the advantage of allowing free circulation of the gas phase around the porous annular substrates.

In an exemplary embodiment, each stack comprises at least one cover disk supported on the porous annular substrate at the top of the stack by means of a sealing ring providing radial sealing between said cover disk and said porous annular substrate at the top of the stack.

Each stack may further comprise a deformable annular seal arranged to be compressed between the cover disk and the support plate of the upper individual module.

The deformable annular seal is, for example, made of carbon fiber felt.

In addition, each stack may further comprise an expanded graphite disk disposed between the deformable annular seal and the support plate of the upper individual module. The expanded graphite disk prevents the deformable annular seal from sticking to the support plate above.

According to a first embodiment, in each individual module, the sealing rings are disposed at the radially outer periphery of the porous annular substrates.

According to a second embodiment, in each individual module, the sealing rings are alternately disposed, along the direction in which the porous annular substrates are stacked, at the radially outer periphery of the porous annular substrates and at the radially inner periphery of the porous annular substrates.

These two embodiments make it possible to maximize the contact surfaces of the porous annular substrates with the gas phase.

The sealing rings are made of Inconel®, for example.

The annular spacers can also be made of Inconel®.

For example, each sealing ring is welded to the annular spacer to which it is coupled. This welding facilitates the formation of the stacks.

According to a particular embodiment, the method further comprises placing a solid cover at the top of the stack of individual modules. This solid cover compresses the deformable elements, especially the sealing rings and deformable annular seals.

According to a particular embodiment, the method further comprises a seal alignment step of the individual modules of the stack comprising, for each first individual module stacked on a second individual module, insertion of the second end of the injection tube of the second individual module into the gas inlet opening of the first individual module stacked on said second individual module, an annular seal being disposed between the second end of the injection tube of the second individual module and the gas inlet opening of the first individual module stacked on said second individual module.

In an exemplary embodiment, for each individual module, the support plate can comprise a first face on which the stack of the individual module is disposed and a second face opposite the first face, the gas inlet opening can comprise a frustoconical shape with a first diameter formed in the second face of the support and a second diameter smaller than the first diameter and formed in the first face or between the first and second faces of the support plate, and the second end of the injection tube can comprise a complementary frustoconical shape cooperating with the frustoconical shape of the gas inlet opening.

The injection tube thus forms a male centering tool and the gas inlet opening a female centering tool cooperating together to ensure good centering of the individual modules with each other.

Preferably, each support plate can comprise, on its first face, a centering ring centered around a gas opening and shaped to receive an injection tube.

The centering ring thus facilitates and optimizes the fitting of the injection tubes on the support plates.

In one example of implementation of the method, the method may further comprise a step of disposing the stack of individual modules on a load-carrying shell disposed on a preheating zone of the densification furnace.

In an exemplary embodiment, each individual module can comprise an annular foot disposed between the support plate of the individual module and the stack of porous annular substrates of the individual module, the annular foot having radial grooves forming passages, along a direction orthogonal to the direction in which the porous annular substrates are stacked between a central cavity of the annular foot and the outside of the annular foot.

According to a particular embodiment, the step of injecting a gas phase into the internal volume of each stack comprises maintaining a pressure difference between the internal volume of the stacks and the outside of the stacks comprised between 0 and 100 millibars.

In an exemplary embodiment, each porous annular substrate can comprise carbon.

In one embodiment, each porous annular substrate may constitute a fibrous brake disc preform.

BRIEF DESCRIPTION OF THE DRAWINGS

FIG. 1, already described, very schematically shows an example of loading porous annular substrates according to the prior art.

FIG. 2 diagrammatically illustrates a sectional view of an example of a stack of porous annular substrates according to the invention.

FIG. 3 schematically shows a sectional view of a densification furnace according to the invention.

FIG. 4 schematically shows a top view of an annular foot.

FIG. 5 schematically shows a sectional view of an annular foot.

DESCRIPTION OF THE EMBODIMENTS

A chemical vapor infiltration densification method according to the invention comprises firstly a step during which a plurality of stacks of porous annular substrates intended to be treated by chemical vapor infiltration are provided.

FIG. 2 illustrates a sectional view of an example of a stack 20 of porous annular substrates 21. The porous annular substrates 21 have cylindrical symmetry and are stacked along a first direction Z. Each porous annular substrate 21 extends mainly in a plane perpendicular to the first direction Z. The sectional plane of the illustration in FIG. 2 comprises the first direction Z and a second direction X perpendicular to the first direction Z. The first direction Z coincides with the axis of symmetry of revolution of the porous annular substrates 21, and the second direction X corresponds to a radial direction.

Each porous annular substrate 21 of the stack 20 thus has the shape of a ring with a central passage 21a. Each porous annular substrate 21 is disposed on an assembly comprising an annular spacer 22 and a sealing ring 23. The outer radial diameter of the annular spacer 22 is smaller than the outer radial diameter of the porous annular substrates 21, the diameters of the orifices of the annular spacers 22 and of the porous annular substrates 21 being equal.

Each annular spacer 22 is surrounded by a sealing ring 23 in the plane perpendicular to the first direction Z. The thickness of the sealing ring 23 measured along the first direction Z is greater than that of the annular spacer 22, so that each porous annular substrate 21 rests on a sealing ring 23. The annular spacers 22 are used to center the sealing rings 23 in the first direction Z.

The alternating stack of porous annular substrates 21 and sealing rings 23 forms, at the center of stack 20, an internal volume 24 of stack 20.

In addition, the stack 20 is closed at its top by an annular cover disk 25. The cover disk 25 is placed on the stack via an annular spacer 22 and a sealing ring 23. The stack further comprises a deformable annular seal 26 made of compressed carbon fiber felt placed on the cover disk 25, and a disk 27 of expanded graphite disposed on the deformable annular seal 26 to prevent this deformable annular seal 26 from sticking to the support plate above.

The stack 20 further comprises an annular secondary sealing ring 28 also made of compressed carbon fiber felt directly on the annular spacer 22 supporting the cover disk 25. The secondary sealing ring 28 covers the part of the annular spacer 22 not covered by the cover disk 25.

The chemical vapor infiltration densification method according to the invention then comprises a step during which a plurality of individual modules 30 are supplied.

FIG. 3 diagrammatically shows a sectional view of a densification furnace according to the invention.

The densification furnace 40 according to the invention comprises a stack of a plurality of individual modules 30. Each individual module 30 comprises a support plate 31 on which is disposed a stack 20 of porous annular substrates via an annular foot 29, the annular foot 29 being disposed between the support plate 31 and the stack 20 of the same individual module 30.

As shown in FIGS. 4 and 5, which show a top view and a sectional view of an annular foot 29, the annular foot 29 comprises radial grooves 295 forming passages along a radial direction, between a central cavity 290 of the annular foot 29 and the outside of the annular foot 29.

As shown in FIG. 3, the support plate 31 of an individual module 30 comprises a gas inlet opening 32 and an injection tube 33 mounted on the gas inlet opening 32 and extending into the internal volume 24 of the stack 20 between a first tube end 33a connected to the support plate 31 and a second tube end 33b which is free.

The injection tube 33 further comprises gas injection orifices 34 opening into the internal volume 24.

The chemical vapor infiltration densification method according to the invention then comprises a step during which a stack of individual modules 30 is formed in the chamber of a densification furnace 40.

FIG. 3 shows the support plate 31 of a first individual module 30a about to be stacked on a second individual module 30b.

The step of forming the stack of individual modules 30 further comprises a step of sealed alignment of the individual modules 30 of the stack. As illustrated in FIG. 3, in order to achieve alignment, the second end 33b of the injection tube 33 of the second individual module 30b is inserted into the gas inlet opening 32 of the first individual module 30a.

To seal the junction between the injection tube 33 of the second individual module 30b and the gas inlet opening 32 of the first individual module 30a, the second individual module 30a further comprises an annular seal 35 disposed between the second end 33b of the injection tube 33 of the second individual module 30b and the gas inlet opening 32 of the first individual module 30a.

More particularly, each support plate 31 comprises a first face 31a on which the stack 20 is disposed and a second face 31b opposite the first face 31a. The gas inlet opening 32 has a frustoconical shape with a first diameter d1 formed in the second face 31b of the support plate 31 and a second diameter d2 smaller than the first diameter d1 and formed between the first face 31a and the second face 31b of the plate support 31.

The second end 33b of each injection tube 33 comprises a frustoconical shape complementary to the frustoconical shape of a gas inlet opening 32 so that the two frustoconical shapes cooperate together. The complementary frustoconical shape of the second end 33b of the injection tube 33 comprises a third diameter larger than a fourth diameter, the fourth diameter being measured on a free distal end while the first diameter is measured on a proximal end coupled to the rest of the injection tube 33 and especially to a main portion 33c.

As illustrated in FIG. 3, in order to improve the sealing of the stack of individual modules 30, the deformable annular seal 26 is dimensioned to fill the gap, along the first direction Z, between the cover disk 25 of the stack 20 of the second individual module 30b and the support plate 31 of the first individual module 30a.

The chemical vapor infiltration densification method according to the invention then comprises a step of disposing the stack of individual modules 30 on a load-carrying shell 42 disposed on a preheating zone 44 of the densification furnace 40.

The chemical vapor infiltration densification method according to the invention then comprises placing a solid cover 46 at the top of the stack of individual modules 30.

The chemical vapor infiltration densification method according to the invention then comprises a step during which a gas phase comprising a gaseous precursor of a matrix material to be deposited within the porosities of substrates 21 is injected into the internal volume 24 of each stack 20 of porous annular substrates 21. The injection of the gas is represented in FIG. 3 by arrows G. The step of injecting a gas into the internal volume 24 of the stacks 20 preferably comprises regulating the pressure difference between the internal volume 24 of the stacks 20 and the outside of the stacks. The pressure difference is preferably maintained between 0 and 100 millibars. Such a range makes it possible to ensure a flow of the gas phase around the porous annular substrates 21 while avoiding the deposition of soot.

The invention claimed is:

1. A method for densification by pressure gradient chemical vapor infiltration of porous annular substrates having a central passage, the method comprising:
    providing a plurality of stacks of porous annular substrates, each stack comprising an internal volume formed by the central passages of the stacked substrates,
    providing a plurality of individual modules, each individual module comprising a support plate and a single stack of porous annular substrates disposed on the support plate, the support plate comprising a gas inlet opening and an injection tube mounted on the gas inlet opening and extending into the internal volume of the stack disposed on the support plate between a first tube end connected to the support plate and a second tube end which is free, the injection tube further comprising gas injection orifices opening into the internal volume,
    forming, in a chamber of a densification furnace, a stack of individual modules, each first individual module stacked on a second individual module having its gas inlet opening of the support plate communicating with the second end of the injection tube of the second individual module on which it is stacked so as to permit circulation of a gas between the individual modules, and
    injecting into the internal volume of each stack of porous annular substrates a gas phase comprising a gaseous precursor of a matrix material to be deposited within the porosities of the substrates,
    wherein, in each individual module, each first porous annular substrate is supported on a second porous annular substrate, or supported on the support plate, by means of a sealing ring providing radial sealing between the first porous annular substrate and the second porous annular substrate or between the first porous annular substrate and said support plate, and each sealing ring is coupled to an annular spacer having an inner diameter equal to an inner diameter of the porous annular substrates, each annular space being surrounded by the sealing ring with which it is associated in a plane perpendicular to the a direction in which the porous annular substrates are stacked, and having a thickness less than the thickness of the sealing ring with which it is coupled.

2. The method according to claim 1, wherein each stack comprises at least one cover disk supported on the porous annular substrate at the top of the stack by means of a sealing ring providing radial sealing between said cover disk and said porous annular substrate at the top of the stack.

3. The method according to claim 2, wherein each stack further comprises a deformable annular seal arranged to be compressed between the cover disk and the support plate of the upper individual module.

4. The method according to claim 1, wherein, in each individual module, the sealing rings are disposed at the radially outer periphery of the porous annular substrates.

5. The method according to claim 1, wherein, in each individual module, the sealing rings are alternately disposed, along the direction in which the porous annular substrates are stacked, at the radially outer periphery of the porous annular substrates and at the radially inner periphery of the porous annular substrates.

6. The method according to claim 1 wherein the sealing rings are made of inconel.

7. The method according to claim 1, wherein each sealing ring is welded to the annular spacer to which it is coupled.

8. The method according to claim 1, further comprising a seal alignment step of the individual modules of the stack comprising, for each first individual module stacked on a second individual module, insertion of the second end of the injection tube of the second individual module into the gas inlet opening of the first individual module stacked on said second individual module, an annular seal being disposed between the second end of the injection tube of the second individual module and the gas inlet opening of the first individual module stacked on said second individual module.

9. The method according to claim 8, wherein, for each individual module, the support plate comprises a first face supporting the stack of the individual module and a second face opposite the first face, the gas inlet opening comprises a frustoconical shape with a first diameter formed in the second face of the support and a second diameter smaller than the first diameter and formed in the first face or between the first face and second face of the support plate, and the second end of the injection tube comprises a complementary frustoconical shape cooperating with the frustoconical shape of the gas inlet opening.

10. The method according to claim 1, further comprising a step of disposing the stack of individual modules on a load-carrying shell disposed on a preheating zone of the densification furnace.

11. The method according to claim 1, wherein each individual module comprises an annular foot disposed between the support plate of the individual module and the stack of porous annular substrates of the individual module, the annular foot having radial grooves forming passages, along a direction orthogonal to the direction in which the porous annular substrates are stacked between a central cavity of the annular foot and the outside of the annular foot.

12. The method according to claim 1, wherein each porous annular substrate comprises carbon.

13. The method according to claim 1, wherein each porous annular substrate constitutes a fibrous brake disc preform.

* * * * *